(12) United States Patent
Motomura et al.

(10) Patent No.: US 8,686,299 B2
(45) Date of Patent: Apr. 1, 2014

(54) ELECTRONIC ELEMENT UNIT AND REINFORCING ADHESIVE AGENT

(75) Inventors: Koji Motomura, Osaka (JP); Seiichi Yoshinaga, Yamanashi (JP); Tadahiko Sakai, Osaka (JP)

(73) Assignee: Panasonic Corporation, Osaka (JP)

( * ) Notice: Subject to any disclaimer, the term of this patent is extended or adjusted under 35 U.S.C. 154(b) by 111 days.

(21) Appl. No.: 13/382,368

(22) PCT Filed: May 26, 2010

(86) PCT No.: PCT/JP2010/003538
§ 371 (c)(1),
(2), (4) Date: Jan. 5, 2012

(87) PCT Pub. No.: WO2011/004542
PCT Pub. Date: Jan. 13, 2011

(65) Prior Publication Data
US 2012/0111617 A1 May 10, 2012

(30) Foreign Application Priority Data
Jul. 8, 2009 (JP) .................................. 2009-161330

(51) Int. Cl.
*H05K 1/16* (2006.01)
*H05K 3/34* (2006.01)
*H05K 3/30* (2006.01)

(52) U.S. Cl.
USPC ................ 174/259; 174/260; 29/840; 29/841

(58) Field of Classification Search
USPC ............................ 174/259, 260; 29/840–841
See application file for complete search history.

(56) References Cited

U.S. PATENT DOCUMENTS

| 4,927,697 A * | 5/1990 | Hill ............................. 428/198 |
| 2008/0207814 A1 * | 8/2008 | Wrosch et al. ................ 524/440 |
| 2008/0308930 A1 | 12/2008 | Yoshida |

FOREIGN PATENT DOCUMENTS

| JP | 04-048686 A | 2/1992 |
| JP | 2004-311898 A | 11/2004 |
| JP | 2008-311458 A | 12/2008 |
| JP | 2008-311459 S | 12/2008 |

OTHER PUBLICATIONS

International Search Report for PCT/JP2010/003538 dated Jul. 20, 2010.

* cited by examiner

*Primary Examiner* — Jeremy Norris
(74) *Attorney, Agent, or Firm* — Pearne & Gordon LLP

(57) ABSTRACT

An electronic element unit (1) includes an electronic element (2) having a plurality of connecting terminals (12) on a lower surface thereof, a circuit board (3) having a plurality of electrodes (22) corresponding to the connecting terminals (12) on an upper surface thereof. The connecting terminals (12) and the electrodes (22) are connected by solder bumps (23), and the electronic element (2) and the circuit board (3) are partly bond by a resin bond part (24) made of a thermosetting material of a thermosetting resin, and a metal powder (25) is included in the resin bond parts (24) in a dispersed state. The metal powder (25) has a melting point lower than a temperature at which the resin bond parts (24) are heated when a work (a repairing work) is carried out for removing the electronic element (2) from the circuit board (3).

5 Claims, 8 Drawing Sheets

(a)

(b)

(c)

(d)

ELECTRONIC ELEMENT UNIT AND REINFORCING ADHESIVE AGENT

TECHNICAL FIELD

The present invention relates to an electronic element unit in which a connecting terminal of an electronic element is connected to an electrode of a circuit board by a solder bump and the electronic element is partly bonded to the circuit board by a thermosetting material of a thermosetting resin and a reinforcing adhesive agent.

BACKGROUND ART

Usually, in the electronic element unit having the connecting terminal of the electronic element connected to the electrode of the circuit board by the solder bump, an electronic element unit is known in which before a connecting terminal of an electronic element is connected to an electrode of a circuit board, or after the connecting terminal is connected to the electrode, a thermosetting resin is supplied to a part between the electronic element and the circuit board to thermally solidify the thermosetting resin so that a columnar resin bond part is formed between the electronic element and the circuit board so as to strongly connect the electronic element to the circuit board (patent literature 1). Further, an electronic element unit is also known in which an inorganic filler such as silica powder is previously added to a thermosetting resin so that a modulus of elasticity of the thermally solidified thermosetting resin is high (hard) to increase a bonding force between an electronic element and a circuit board and improve a bonding reliability.

LITERATURE OF RELATED ART

Patent Literature

Patent Literature 1: JP-A-2004-311898

SUMMARY OF THE INVENTION

Problems that the Invention is to Solve

However, when the silica powder is added to the thermosetting resin to increase the hardness of a thermally solidified material, temperature necessary for softening the resin bond part is high when a work for removing defective electronic element (a repairing work) is carried out. Thus, a problem arises that a thermal damage may be possibly given to the electronic element or the circuit board.

Thus, it is an object of the present invention to provide an electronic element unit and a reinforcing adhesive agent in which a bonding strength can be improved between an electronic element and a circuit board and a repairing work can be carried out without giving a thermal damage to the electronic element or the circuit board.

Means for Solving the Problems

An electronic element unit of the present invention includes an electronic element unit comprising an electronic element having a plurality of connecting terminals on a lower surface thereof, and a circuit board having a plurality of electrodes corresponding to the connecting terminals on an upper surface thereof, wherein the connecting terminals and the electrodes are connected by solder bumps, the electronic element and the circuit board are partly bonded by a resin bond part made of a thermosetting material of a thermosetting resin, and metal powder is included in the resin bond part in a dispersed state.

In the above-described structure, the metal powder has a melting point lower than a temperature at which the resin bond parts are heated when a work is carried out for removing the electronic element from the circuit board.

In the above-structure, the metal powder is formed with either single metal composed of Sn, Bi or In, or an alloy including at least two kinds or more of Sn, Bi, In, Zn, Sb, Cu, Pb, Cd, Ag and Au and having a melting point of 300° C. or lower.

A reinforcing adhesive agent of the present invention used for forming a resin bond part of an electronic element unit including electronic element having a plurality of connecting terminals on a lower surface thereof; a circuit board having a plurality of electrodes corresponding to the connecting terminals on an upper surface thereof; wherein the connecting terminals and the electrodes are connected by solder bumps, the electronic element and the circuit board are partly bonded by the resin bond part made of a thermosetting material of a thermosetting resin, and metal powder is included in the thermosetting resin in a dispersed state In the above-described structure, the metal powder has a melting point lower than a temperature at which the resin bond part is heated when a work is carried out for removing the electronic element from the circuit board.

In the above-described structure, the metal powder is formed with either single metal composed of Sn, Bi or In, or an alloy including at least two kinds or more of Sn, Bi, In, Zn, Sb, Cu, Pb, Cd, Ag and Au, and the metal powder has a melting point of 300° C. or lower.

In the above-described structure, the metal powder is covered with a film having a melting point higher than a temperature at which the resin bond part is heated when a work is carried out for removing the electronic element from the circuit board.

Advantage of the Invention

In the present invention, the resin bond part made of the thermally solidified material or the thermosetting material of the thermosetting resin (or the thermosetting resin of the reinforcing adhesive agent used for forming the resin bond parts) that partly bond the electronic element to the circuit board have the metal powder included in the dispersed state. The thermally solidified material or the thermosetting material of the thermosetting resin in which the metal powder is included in the dispersed state has a property that a modulus of elasticity is high under a room temperature and a hardness is increased, on the other hand, when the resin bond parts are heated to a temperature higher than a melting point of a solder, the modulus of elasticity is extremely lowered so that the resin bond parts are easily softened. Accordingly, since the electronic element unit provided with the above-described resin bond parts (or the resin bond parts formed with the reinforcing adhesive agent) is high in its bonding reliability and can suppress a temperature necessary for softening the resin bond parts when a repairing work is carried out to a low temperature, a bonding strength can be improved between the electronic element and the circuit board and the repairing work can be carried out without giving a thermal damage to the electronic element or the circuit board.

MODE FOR CARRYING OUT THE INVENTION

First Embodiment

Figure 1:
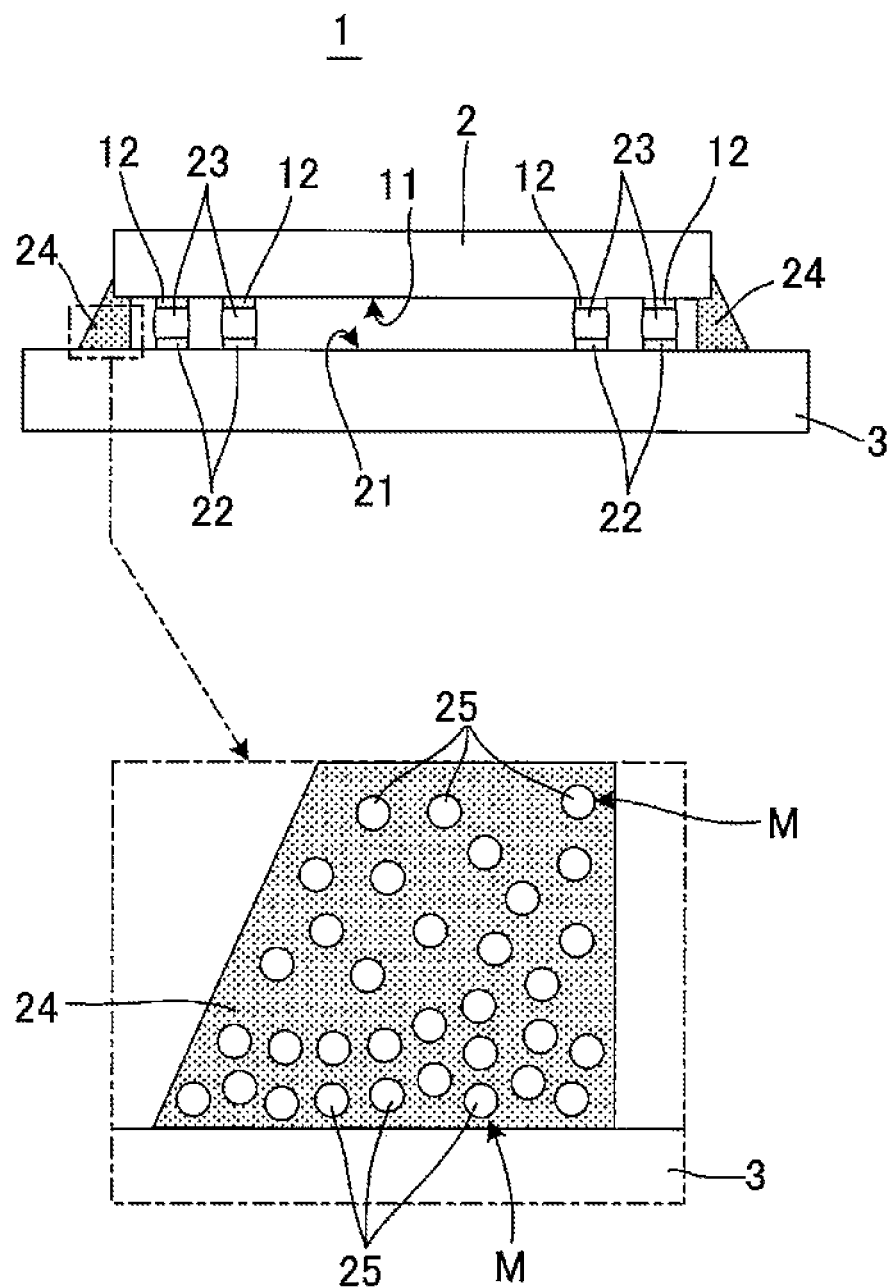
FIG. 1 is a side view of an electronic element unit in a first embodiment of the present invention.

In FIG. 1, an electronic element unit 1 in a first embodiment includes an electronic element 2 and a circuit board 3. A plurality of connecting terminals 12 formed on a terminal forming surface 11 of a lower surface of the electronic element 2 are connected to a plurality of electrodes 22 formed on an electrode forming surface 21 of an upper surface of the circuit board 3 by solder bumps 23. The solder bumps 23 are formed on the connecting terminals 12 before the connecting terminals 12 are connected to the electrodes 22, and heated and molten to connect the connecting terminals 12 to the electrodes 22 when the connecting terminals 12 are connected to the electrodes 22.

In FIG. 1, in a plurality of parts between the lower surface of the electronic element 2 and the upper surface of the circuit board 3, columnar resin bond parts 24 made of a thermosetting material of a thermosetting resin are provided. The terminal forming surface 11 of the electronic element 2 and the electrode forming surface 21 of the circuit board 3 which are opposed in the vertical direction are partly bonded by the plurality of resin bond parts 24.

In an enlarged view of FIG. 1, metal powder 25 is included in a dispersed state respectively in the resin bond parts 24. The metal powder 25 has a melting point lower than a temperature (for the convenience of explanation, refer it to as a "repairing work temperature", hereinafter) at which the resin bond parts 24 are heated when a work (a repairing work) is carried out for removing the electronic element 2 from the circuit board 3. As the metal powder 25, is selected either single metal composed of, for instance, Sn (tin), Bi (bismuth) and In (indium), or an alloy including at least two kinds or more of Sn, Bi, In, Zn (zinc), Sb (antimony), Cu (copper), Pb (lead), Cd (cadmium), Ag (silver) and Au (gold), and the metal powder 25 has a melting point of 300° C. or lower.

Figure 2:
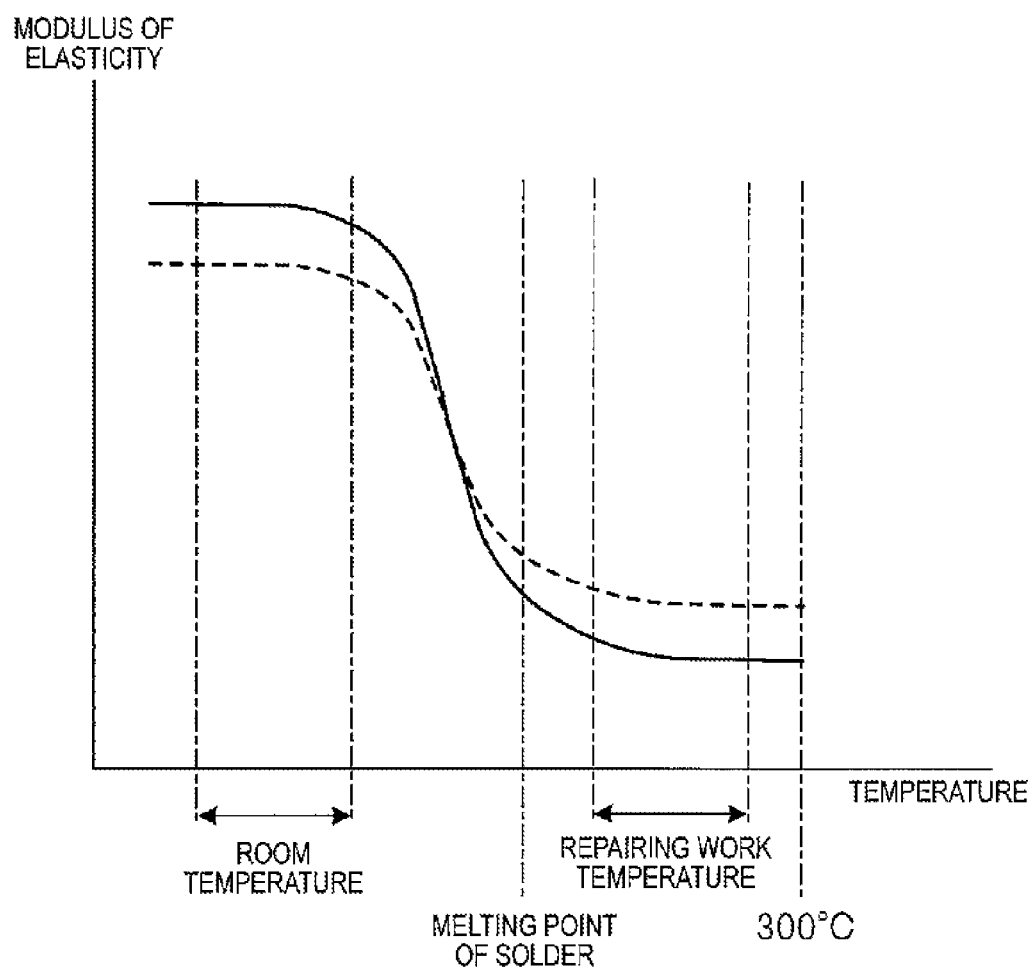
FIG. 2 is a graph showing relations between a temperature and a modulus of elasticity of a resin bond part of the electronic element unit in the first embodiment of the present invention and a resin bond part of a usual electronic element unit, respectively.

In the resin bond parts 24 (the thermosetting material of the thermosetting resin) in which the metal powder 25 is included in a dispersed state, a modulus of elasticity is high under a room temperature and a hardness is increased. On the other hand, when the resin bond parts are heated to the temperature higher than the melting point of a solder, the modulus of elasticity is extremely lowered so that the resin bond parts are easily softened. This phenomenon is supposed to occur due to a reason that when the thermosetting material of the thermosetting resin (the resin bond part 24) in which the metal powder 25 is included in the dispersed state is heated to the temperature higher than the melting point of the solder, the metal powder 25 is liquefied in the resin bond part 24 and the liquefied metal powder 25 is scattered in the resin bond part 24. A graph shown by a full line in FIG. 2 illustrates a relation between the temperature and the modulus of elasticity (hardness) of the resin bond part 24 in the electronic element unit 1. A graph shown by a broken line in FIG. 2 illustrates a relation between a temperature and a modulus of elasticity of a resin bond part of a usual electronic element unit in which metal powder 25 in a dispersed state is not included.

Figure 3:
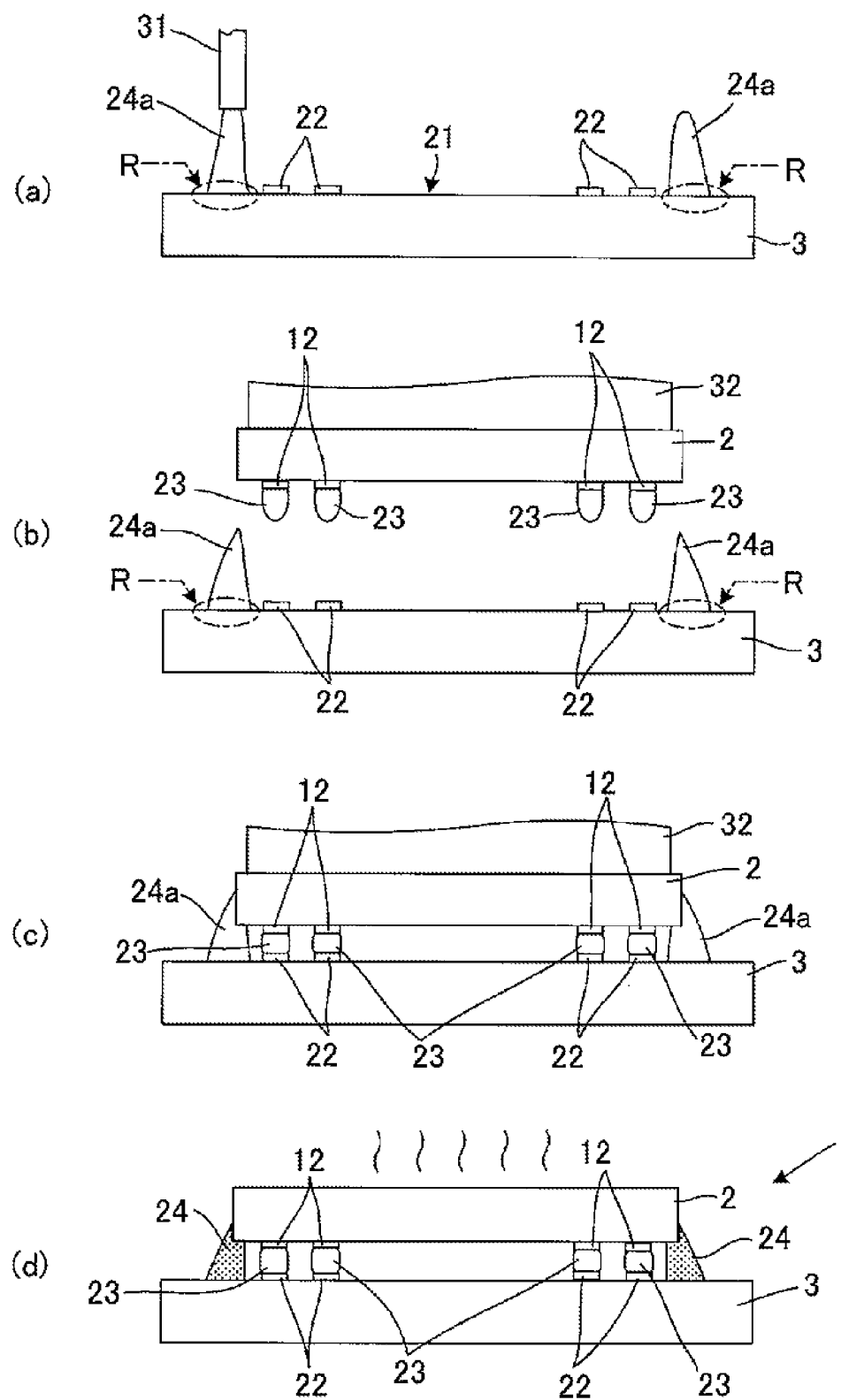
FIGS. 3(a) to 3(d) are explanatory views of manufacturing processes of the electronic element mounting unit in the first embodiment of the present invention.

Now, referring to FIG. 3, a manufacturing procedure of the electronic element unit 1 will be described below. In manufacturing the electronic element unit 1, initially, a reinforcing adhesive agent 24a made of the thermosetting resin in which the metal powder 25 is included in the dispersed state is supplied to a plurality of resin supply positions R that avoid the electrodes 22 on the electrode forming surface 21 of the circuit board 3 by a dispenser 31 as a resin supply unit (FIG. 3(a), a resin supply process).

Figure 4:
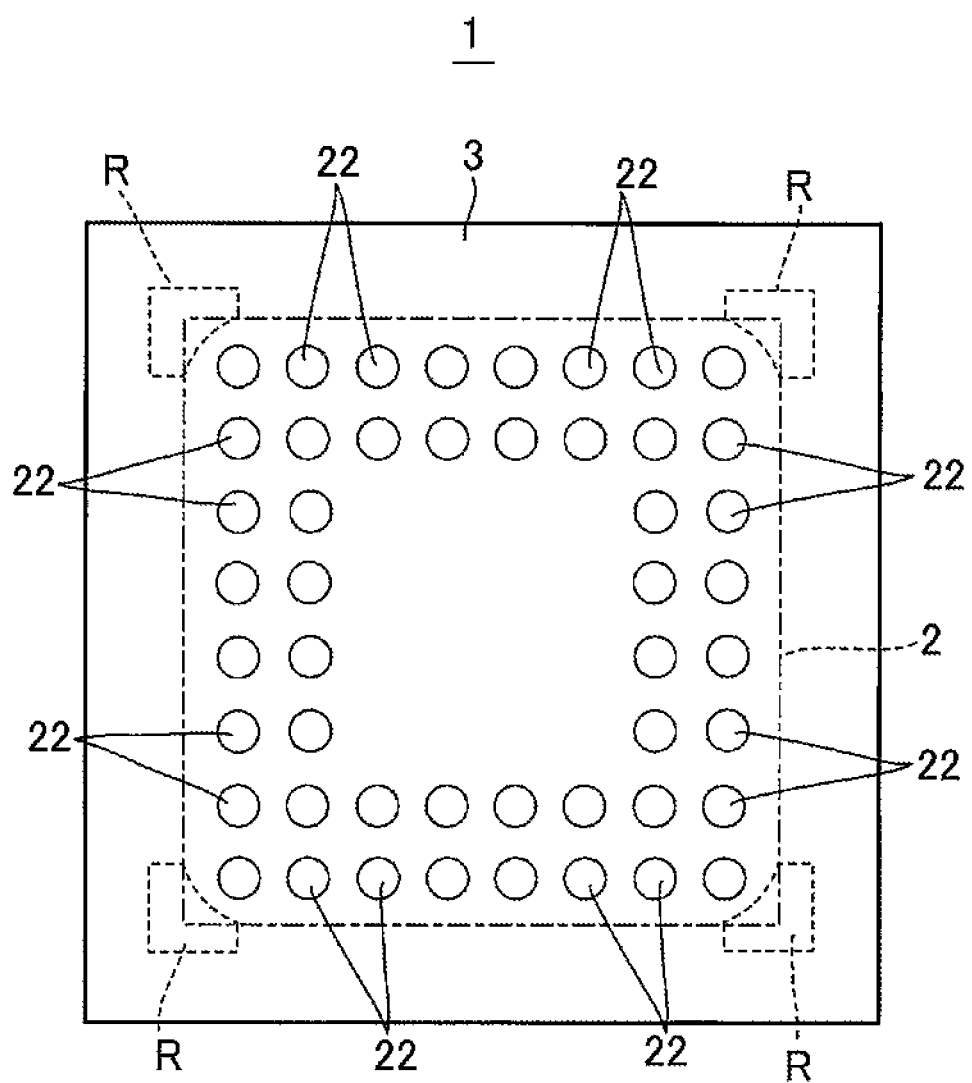
FIG. 4 is a plan view of the electronic element unit in the first embodiment of the present invention.
Figure 5:
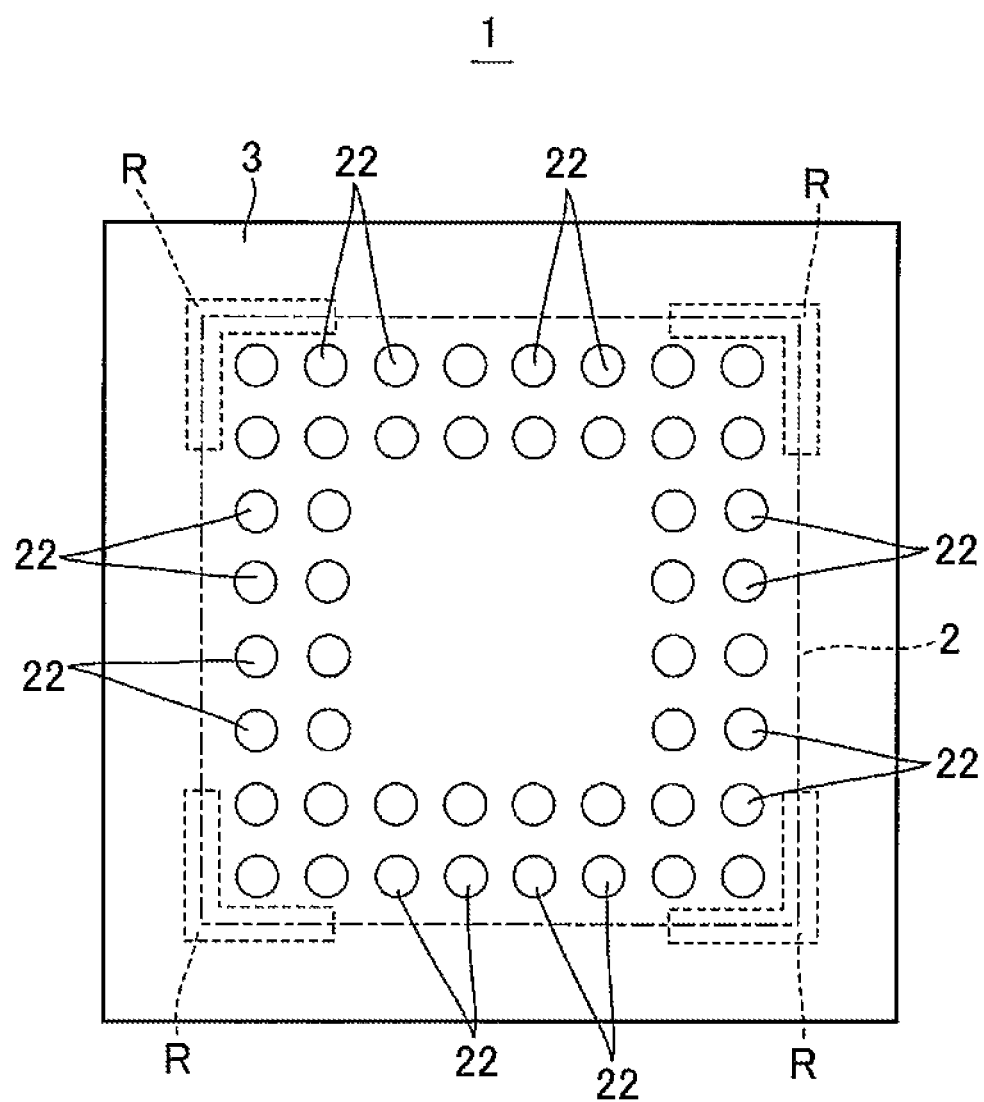
FIG. 5 is a plan view of the electronic element unit in the first embodiment of the present invention.
Figure 6:
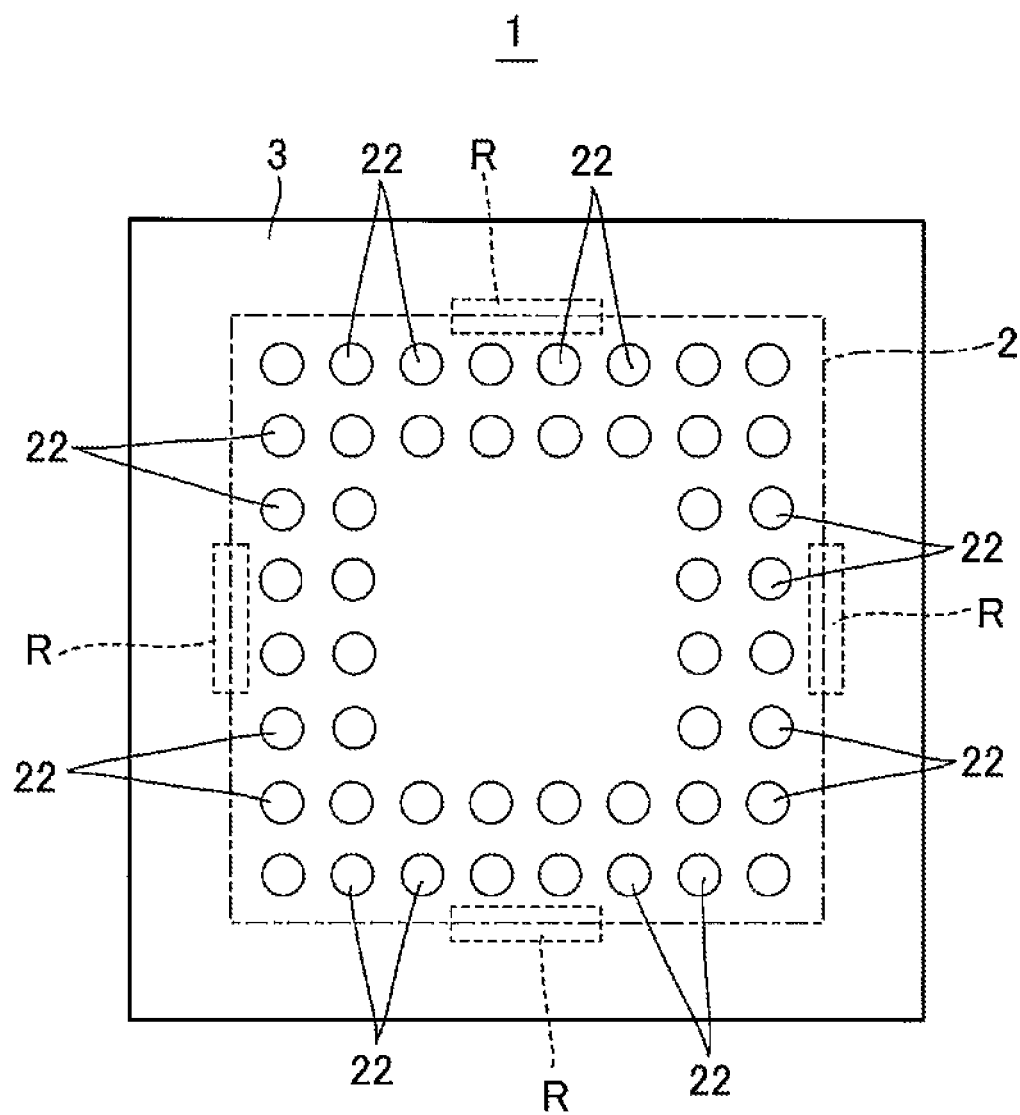
FIG. 6 is a plan view of the electronic element unit in the first embodiment of the present invention.
Figure 7:
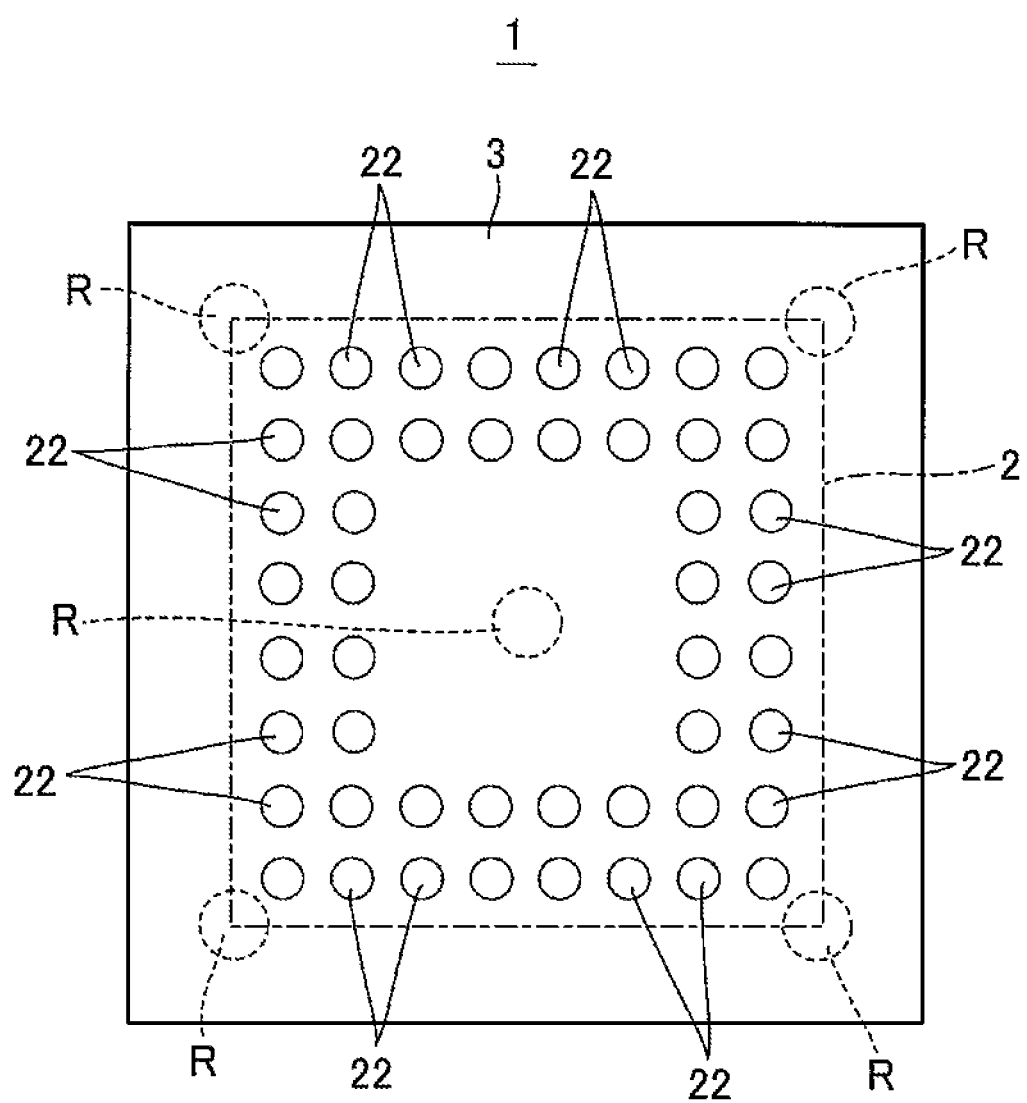
FIG. 7 is a plan view of the electronic element unit in the first embodiment of the present invention.

The resin supply positions R on the circuit board 3 may be set to, for instance, four corners of the circuit board 3 as shown in FIG. 4 and FIG. 5 or may be set to positions along four sides of the circuit board 3 as shown in FIG. 6. Otherwise, the resin supply positions may be set to a position at a central part of the circuit board 3 where the electrodes 22 do not exist as well as the four corners of the circuit board 3 as shown in FIG. 7.

When the reinforcing adhesive agent 24a is supplied respectively to the resin supply positions R on the electrode forming surface 21 of the circuit board 3, after the electronic element 2 is adsorbed by an adsorbing nozzle 32 under a position where the solder bumps 23 formed in the electrode forming surface 21 of the electronic element 2, that is, the connecting terminals 12, are directed downward, the connecting terminals 12 of the electronic element 2 are respectively positioned to the corresponding electrodes 22 of the circuit board 3 so that the connecting terminals 12 of the electronic element 2 respectively correspond to the electrodes 22 of the circuit board 3 in the vertical direction (FIG. 3(b), a positioning process). Then, the adsorbing nozzle 32 is lowered to allow the lower surface (the terminal forming surface 11) of the electronic element 2 to come into contact with the reinforcing adhesive agent 24a supplied to the upper surface of the circuit board 3 and the connecting terminals 12 of the electronic element 2 respectively to come into contact with the electrodes 22 of the circuit board 3 from an upper part. (A terminal and electrode contact process. FIG. 3(c))

When the connecting terminals 12 are allowed to come into contact with the electrodes 22, an adsorption of the electronic element 2 by the adsorbing nozzle 32 is released. After the adsorbing nozzle 32 is lifted to separate the electronic element 2 from the adsorbing nozzle 32, a heating operation is carried out in a re-flow furnace not shown in the drawing. Thus, the solder bumps 23 are molten to solder and connect the connecting terminals 12 to the electrodes 22 and the reinforcing adhesive agent 24a is thermally solidified (a heating process (FIG. 3(d)). Thus, the reinforcing adhesive agent 24a between the electronic element 2 and the circuit board 3 is thermally solidified to form a plurality of thermally solidified materials of the reinforcing adhesive agent 24a, that is, the resin bond parts 24 between the electronic element 2 and the circuit board 3. Thus, the electronic element 2 is connected to the circuit board 3 and a connected body 1a of the electronic element 2 and the circuit board 3 is formed. When the connected body 1a is formed, the connected body 1a is cooled to solidify the resin bond parts 24 respectively of the connected body 1a (a cooling process). Thus, the electronic element unit 1 is completed.

When the repairing work of the electronic element unit 1 manufactured in such a way is carried out, the resin bond parts 24 (an entire part of the electronic element unit 1) are heated to a prescribed temperature (the above-described "repairing work temperature") suitable for the repairing work. Since the repairing work needs to be carried out by melting the solder bumps 23, the repairing work temperature is at least higher than the melting point of the solder (see FIG. 2), however, the repairing work temperature is set to 300° C. or lower by considering an influence of an inconvenience occurring when the electronic element 2 is heated to a high temperature. The surface of the metal powder 25 included in the resin bond parts 24 (the inner part of the thermosetting resin of the reinforcing adhesive agent 24a) may be covered with a film (an oxide film) M having a melting point higher than the above-described repairing work temperature, as shown in an enlarged view of FIG. 1 (namely, the oxide film M does not need to be removed). This is due to a reason that the thermosetting resin (the reinforcing adhesive agent 24a) including the metal powder 25 is apparently different in its use from solder paste which has solder particles mixed in the thermosetting resin to be used for connecting a connecting terminal to an electrode.

When the resin bond parts 24 are heated to the repairing work temperature, the metal powder 25 included in the resin bond parts 24 in the dispersed state is molten to operate so as to lower the modulus of elasticity of the resin bond parts 24. Thus, at the repairing work temperature, the resin bond parts 24 have a degree of softening higher than that when the metal powder 25 is not included, so that the repairing work is easily carried out (see FIG. 2). Further, the resin bond parts 24 are easily separated on an interface to the upper surface (the electrode forming surface 21) of the circuit board 3, which is preferably suitable for the repairing work. This phenomenon is supposed to occur due to a reason that a part of the metal powder 25 included in the resin bond part 24 is mal-distributed in a lower part of the resin bond part 24 owing to its weight (tare weight) (the thermosetting resin is thermally solidified under a state that the metal power 25 is mal-distributed in the lower part) (see the enlarged view in FIG. 1).

Second Embodiment

Figure 8:
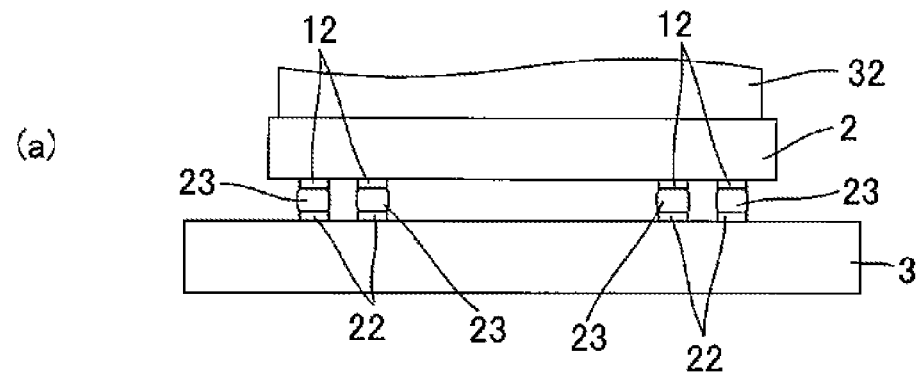
FIGS. 8(a) to 8(d) are explanatory views of manufacturing processes of an electronic element mounting unit in a second embodiment of the present invention.
Figure 8:
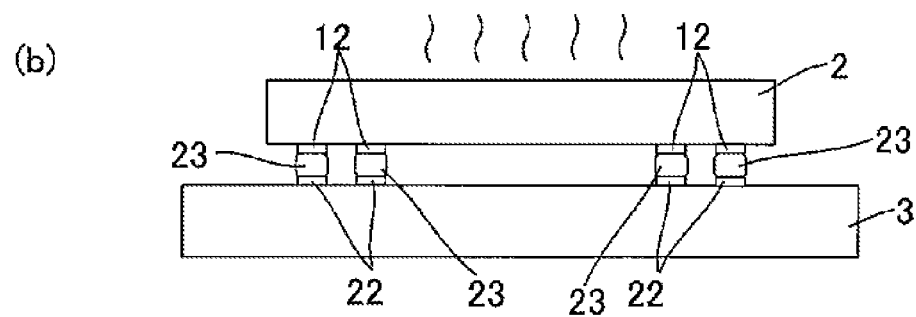
Figure 8:
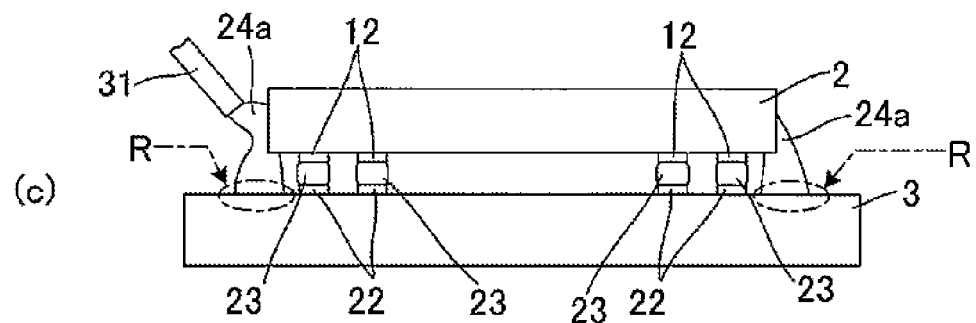
Figure 8:
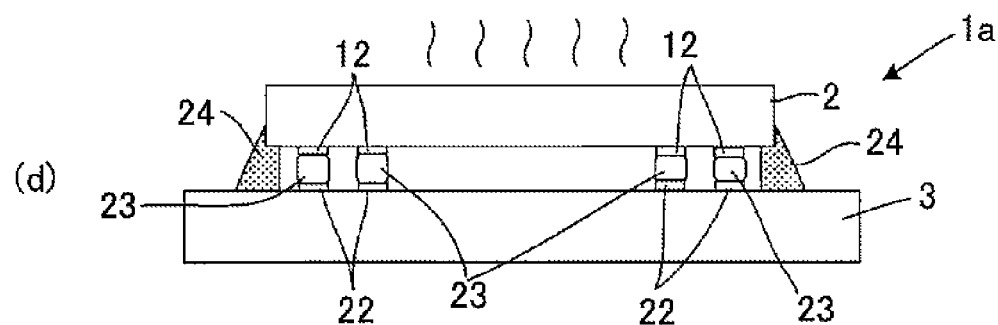

Now, a second embodiment will be described below by referring to FIG. 8. In the second embodiment, a structure of a manufactured electronic element unit 1 is the same as the above-described structure of the electronic element unit, however, a manufacturing procedure is different from the above-described manufacturing procedure. When the electronic element unit 1 in the second embodiment is manufactured, initially, after an electronic element 2 is adsorbed by an adsorbing nozzle 32 in such a way that an electrode forming surface 21 of the electronic element 2 (namely, solder bumps 23 formed in connecting terminals 12) is directed downward and the connecting terminals 12 of the electronic element 2 are respectively positioned to corresponding electrodes 22 of a circuit board 3 so that the connecting terminals 12 of the electronic element 2 respectively correspond to the electrodes 22 of the circuit board 3 in the vertical direction (a positioning process), the adsorbing nozzle 32 is lowered to allow the connecting terminals 12 of the electronic element 2 respectively to come into contact with the electrodes 22 of the circuit board 3 from an upper part (FIG. 8(a). A terminal and electrode contact process). Then, an adsorption of the electronic element 2 by the adsorbing nozzle 32 is released to lift the adsorbing nozzle 32 and separate the electronic element 2 from the adsorbing nozzle 32. Then, the electronic element and the circuit board are heated by a re-flow furnace not shown in the drawing to melt the solder bumps 23 and solder and connect the connecting terminals 12 of the electronic element 2 to the electrodes 22 of the circuit board 3. (FIG. 8(b), A terminal and electrode connecting process)

When the connecting terminals 12 of the electronic element 2 are soldered and connected to the electrodes 22 of the circuit board 3, the electronic element 2 and the circuit board 3 connected by the solder are taken out from the re-flow furnace to supply a reinforcing adhesive agent 24a to a plurality of resin supply positions R that avoid connected parts of the connecting terminals 12 to the electrodes 22 between a lower surface (a terminal forming surface 11) of the electronic element 2 and an upper surface (an electrode forming surface 21) of the circuit board 3 by a dispenser 31 (FIG. 8(c), a resin supply process). The resin supply positions R on the circuit board 3 are the same as those in the case of the first embodiment.

When the reinforcing adhesive agent 24a is supplied to a part between the lower surface of the electronic element 2 and the upper surface of the circuit board 3, the electronic element 2 and the circuit board 3 between which the reinforcing adhesive agent 24a is supplied are heated in a heating device or a re-flow furnace (the re-flow furnace used herein does not need to be the same as the re-flow furnace used in the above-described terminal and electrode connecting process) to thermally solidify the reinforcing adhesive agent 24a (FIG. 8(d). A resin thermally solidifying process). Thus, the reinforcing adhesive agent 24a between the electronic part 2 and the circuit board 3 is thermally solidified, so that a plurality of thermally solidified materials of the reinforcing adhesive agent 24a, that is, resin bond parts 24 are formed between the electronic element 2 and the circuit board 3 to connect the electronic element 2 to the circuit board 3 and a connected body 1a of the electronic element 2 and the circuit board 3 is formed.

When the connected body 1a is formed, the connected body 1a of the electronic element 2 and the circuit board 3 is cooled to solidify the resin bond parts 24 respectively of the connected body 1a (a cooling process). Thus, the electronic element unit 1 is completed. A procedure of a repairing work of the electronic element unit 1 completed in such a way is the same as that in the case of the first embodiment.

As described above, the electronic element unit 1 in the present embodiment includes the electronic element 2 having the plurality of connecting terminals 12 on the lower surface, the circuit board 3 having on the upper surface the plurality of electrodes 22 corresponding to the connecting terminals 12, the solder bumps 23 that connect the connecting terminals 12 to the electrodes 22 and the resin bond parts 24 made of the thermosetting material of the reinforcing adhesive agent 24a that partly bond the electronic element 2 to the circuit board 3, and metal powder 25 is included in the resin bond parts 24 in a dispersed state.

Further, the reinforcing adhesive agent 24a in the embodiment is used for forming the resin bond parts 24 of the electronic element unit 1 and includes the metal powder 25 in a thermosetting resin in the dispersed state. In the electronic element unit 1 and the reinforcing adhesive agent 24a, the metal powder 25 has a melting point lower than a temperature (a repairing work temperature) for heating the resin bond parts 24 when a work (the repairing work) for removing the electronic element 2 from the circuit board 3 is carried out.

In the present embodiment, the resin bond parts 24 made of the thermally solidified material of the thermosetting resin (or the thermosetting resin of the reinforcing adhesive agent 24a used for forming the resin bond parts 24) that partly bond the electronic element 2 to the circuit board 3 have the metal powder 25 included in the dispersed state. The thermally solidified material of the thermosetting resin (the resin bond parts 24) in which the metal powder 25 is included in the dispersed state has a property that a modulus of elasticity is high under a room temperature and a hardness is increased, on the other hand, when the resin bond parts are heated to a temperature higher than a melting point of a solder, the modulus of elasticity is extremely lowered so that the resin bond parts are easily softened.

Accordingly, since the electronic element unit 1 provided with the above-described resin bond parts 24 (or the resin bond parts 24 formed with the reinforcing adhesive agent 24a) is high in its bonding reliability and can suppress the temperature (the repairing work temperature) necessary for softening the resin bond parts 24 when the repairing work is carried out to a low temperature, a bonding strength can be improved between the electronic element 2 and the circuit board 3 and the repairing work can be carried out without giving a thermal damage to the electronic element 2 or the circuit board 3.

The present invention is described in detail by referring to the specific embodiments, however, it is to be understood to a person with ordinary skill in the art that various changes or modifications may be made without departing the spirit and scope of the present invention.

This application is based on Japanese Patent Application (JPA No. 2009-161330) filed on Jul. 8, 2009 and contents thereof are incorporated herein as a reference.

INDUSTRIAL APPLICABILITY

The electronic element unit and the reinforcing adhesive agent are provided in which a bonding strength can be improved between the electronic element and the circuit board and the repairing work can be carried out without giving a thermal damage to the electronic element or the circuit board.

DESCRIPTION OF REFERENCE NUMERALS AND SIGNS

1 . . . electronic element unit
2 . . . electronic element
3 . . . circuit board
12 . . . connecting terminal
22 . . . electrode
23 . . . solder bump
24 . . . resin bond part
24a . . . reinforcing adhesive agent
25 . . . metal powder M . . . film

The invention claimed is:

1. An electronic element unit comprising:
an electronic element having a plurality of connecting terminals on a lower surface thereof; and
a circuit board having a plurality of electrodes corresponding to the connecting terminals on an upper surface thereof;
wherein the connecting terminals and the electrodes are connected by solder bumps, the electronic element and the circuit board are partly bonded by a resin bond part made of a thermosetting material of a thermosetting resin, and metal powder is included in the resin bond part in a dispersed state, and
wherein the metal powder has a melting point lower than a heating temperature of the resin bond part for removing the electronic element from the circuit board.

2. The electronic element unit according to claim 1, wherein the metal powder is formed with either single metal composed of Sn, Bi or In, or an alloy including at least two kinds or more of Sn, Bi, In, Zn, Sb, Cu, Pb, Cd, Ag and Au, and the metal powder has a melting point of 300° C. or lower.

3. A reinforcing adhesive agent used for forming a resin bond part of an electronic element unit including electronic element having a plurality of connecting terminals on a lower surface thereof; a circuit board having a plurality of electrodes corresponding to the connecting terminals on an upper surface thereof; wherein the connecting terminals and the electrodes are connected by solder bumps, the electronic element and the circuit board are partly bonded by a resin bond part made of a thermosetting material of a thermosetting resin,
wherein metal powder is included in the thermosetting resin in a dispersed state, and
wherein the metal powder has a melting point lower than a heating temperature of the resin bond part for removing the electronic element from the circuit board.

4. The reinforcing adhesive agent according to claim 3, wherein the metal powder is formed with either single metal composed of Sn, Bi or In, or an alloy including at least two kinds or more of Sn, Bi, In, Zn, Sb, Cu, Pb, Cd, Ag and Au, and the metal power has a melting point of 300° C. or lower.

5. The reinforcing adhesive agent according to claim 3 or 4, wherein the metal powder is covered with a film having a melting point higher than a heating temperature of the resin bond part for removing the electronic element from the circuit board.

* * * * *